(12) United States Patent
Pellat et al.

(10) Patent No.: US 9,824,912 B2
(45) Date of Patent: Nov. 21, 2017

(54) METHOD OF TRANSFORMING AN ELECTRONIC DEVICE

(71) Applicant: Commissariat a L'Energie Atomique et aux Energies Alternatives, Paris (FR)

(72) Inventors: Michel Pellat, Grenoble (FR); Franck Fournel, Villard-Bonnot (FR); Pierre Montmeat, Froges (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/970,790

(22) Filed: Dec. 16, 2015

(65) Prior Publication Data
US 2016/0181139 A1 Jun. 23, 2016

(30) Foreign Application Priority Data

Dec. 19, 2014 (FR) .................... 14 62978

(51) Int. Cl.
*H01L 21/00* (2006.01)
*H01L 21/683* (2006.01)
(Continued)

(52) U.S. Cl.
CPC .......... *H01L 21/6835* (2013.01); *H01L 21/78* (2013.01); *H01L 24/13* (2013.01);
(Continued)

(58) Field of Classification Search
CPC ....... H01L 2224/48091; H01L 2224/94; H01L 2224/48465; H01L 2224/97; H01L 2924/181; H01L 21/6835
See application file for complete search history.

(56) References Cited

U.S. PATENT DOCUMENTS

| 4,794,092 A | 12/1988 | Solomon |
| 2007/0068454 A1* | 3/2007 | Saeki ............... H01L 21/6838 118/715 |

(Continued)

FOREIGN PATENT DOCUMENTS

JP 2014-133855 7/2014

OTHER PUBLICATIONS

French Preliminary Search Report dated Nov. 11, 2015 in French Application 14 62978, filed on Dec. 19, 2014 (with English Translation of Categories of Cited Documents and Written Opinion).

(Continued)

*Primary Examiner* — Zandra Smith
*Assistant Examiner* — John M Parker
(74) *Attorney, Agent, or Firm* — Oblon, McClelland, Maier & Neustadt, L.L.P.

(57) ABSTRACT

There is provided a method for transforming an electronic device from an initial state, wherein the device includes a first substrate and a second substrate, the first and second substrates being joined by means of a bonding interfaced using their respective first faces, wherein the first substrate includes at least one cavity, produced using the first face of the first substrate, the cavity including a bottom bordered by at least one peripheral region and being at least partially filled with a buffer layer, in the bottom of the cavity, and wherein the first face of the second substrate is at least partly opposite the cavity of the first substrate. The method also includes a step of removing the bottom of the cavity of the first substrate from a first face, opposite to the first face of the first substrate.

14 Claims, 3 Drawing Sheets

(51) Int. Cl.
*H01L 21/78* (2006.01)
*H01L 23/00* (2006.01)

(52) U.S. Cl.
CPC ...... *H01L 24/16* (2013.01); *H01L 2221/6834* (2013.01); *H01L 2221/68318* (2013.01); *H01L 2221/68327* (2013.01); *H01L 2221/68368* (2013.01); *H01L 2221/68381* (2013.01); *H01L 2224/13147* (2013.01); *H01L 2224/16227* (2013.01); *H01L 2224/81007* (2013.01)

(56) References Cited

U.S. PATENT DOCUMENTS

| | | |
|---|---|---|
| 2009/0159208 A1 | 6/2009 | Kirby |
| 2011/0006400 A1 | 1/2011 | Souriau et al. |
| 2011/0264152 A1 | 10/2011 | Weiman et al. |
| 2014/0084423 A1 | 3/2014 | Priewasser |
| 2014/0110894 A1 | 4/2014 | Lee et al. |
| 2014/0340900 A1* | 11/2014 | Bathurst et al. .......... F21K 9/00 362/249.02 |

OTHER PUBLICATIONS

Extended European Search Report dated May 9, 2016 in Patent Application No. 15199956.2 (with English translation of categories of cited documents).

* cited by examiner

METHOD OF TRANSFORMING AN ELECTRONIC DEVICE

FIELD OF THE INVENTION

The present invention relates to three-dimensional 3D integration for electronic devices and in particular microelectronic devices, the term microelectronic including nanotechnologies. The invention relates more particularly to the production of electronic devices that have to be handled carefully during manufacture thereof.

TECHNOLOGICAL BACKGROUND

Recent progress in the field of microelectronics has led to the development of systems for producing fine or even ultra-fine wafers, the thickness of which is typically between 20 and 200 microns. Several techniques have been developed for the processing and handling of these fine wafers, in particular by temporary adhesive bonding methods. More precisely, the technique of temporary adhesive bonding makes it possible to manipulate and perform technological steps on a fine wafer supported by a so-called "support" or "handle" wafer, for example made from glass or silicon, which remains thicker. It is a question of temporarily bonding the fine wafer on which technological steps are to be performed on a "support" wafer, providing the mechanical rigidity for the whole. When all the steps have ended, the fine wafer will be detached from the "support" wafer. The thinning, to obtain the fine wafer, may also take place after bonding to a support substrate, the wafer thus thinned then being able or not to undergo additional technological steps with a view to producing all or some of the electronic and/or optical and/or mechanical components. In many temporary adhesive bonding techniques, the detachment takes place with a concatenation of chemical and mechanical actions.

The document US 2014/0084423 describes a method for the temporary adhesive bonding of a thinned wafer on a "support" wafer. The method further comprises a step of trimming the peripheral region of the thinned wafer. This step of cutting the edges of the previously thinned wafer then supported by the "support" wafer is performed by means of a diamond wheel. This trimming step is normally carried out by a mechanical means. It may thus cause a posteriori damage on the thinned wafer. The cutting step is followed by a step of joining the thinned wafer from the "support" wafer. This series of steps has limitations for fine wafers. This is because, where the wafer obtained after the disjoining step is particularly fine (extending from a thickness of less than 200 microns for example), no solution allowing manipulation without risk of breaking the thinned wafer is envisaged. In this case, no method can consequently be envisaged after disjoining; a method of cutting the thinned wafer chip by chip will for example be unachievable. Where the thinned wafer obtained after the disjoining step has a high mechanical stress, there are also high chances that the thinned wafer may a posteriori undergo deformation in a tile shape, which there also makes it tricky to handle the thinned and very probably weakened wafer during the continuation of the production method. Thus the method proposed in the document US 2014/0084423, because of the weakening of the thinned wafer that it causes following the mechanical stresses produced on said wafer, is difficult to implement industrially.

The present invention makes it possible to solve all or at least some of the drawbacks of the current techniques by proposing an alternative production method compatible with use in industry.

SUMMARY OF THE INVENTION

One aspect of the invention relates to a method for transforming an electronic device from an initial state wherein the device comprises a first substrate and a second substrate, said first and second substrates being joined together by means of a bonding interface using their first respective faces, an initial state wherein the first substrate comprises at least one cavity, produced from the first face of the first substrate, said cavity comprising a bottom bordered by at least one peripheral region and being filled at least partially with a buffer layer, and wherein the first face of the second substrate is at least partly facing the cavity of the first substrate. The method comprises a step of removing the bottom of the cavity of the first substrate as from a second face, opposite to the first face of the first substrate. Preferably, the peripheral region is bonded to the first face of the second substrate in order to form at least part of the bonding interface. This bonding preferably occurs without the presence of the material of the buffer layer at their interface. Furthermore, it is advantageous that the method comprises a step of removing the bottom of the cavity of the first substrate as from a second face, opposite to the first face of the first substrate.

The invention also relates to an electronic device comprising a first substrate and a second substrate, said first and second substrates being joined together by means of a bonding interface from their respective first faces, wherein the first substrate comprises at least one cavity, produced from the first face of the first substrate, said cavity being bordered by at least one peripheral region and wherein the first face of the second substrate is at least partly facing the cavity of the first substrate. Advantageously, the cavity emerges from a second face, opposite to the first face of the first substrate. Preferably, the peripheral region is bonded to the first face of the second substrate, and preferably without the presence of the material of the buffer layer at their interface, in order to form at least part of the bonding interface.

The invention relates to a system comprising the device according to the present invention and comprising a third substrate; the device being joined by its second face, advantageously opposite to its first face, to a face of the third substrate.

The present invention proposes an alternative temporary bonding method for preserving to the maximum possible extent the substrate that has previously undergone thinning during the production method. The present invention avoids having recourse, during the production method, to mechanical actions that may cause risks of cracks or even breaking. Advantageously, the method according to the present invention is compatible with an industrial environment.

According to indicative advantageous aspects, embodiments of the invention make it possible to have an adhesion region that is much stronger with the second substrate at the peripheral region than at the buffer layer, which reinforces the global adhesion of the two substrates and allows the use of much more numerous buffer layer materials. This may also make it possible, because of the weak adhesion possible at the buffer layer, to facilitate elimination thereof. In addition, the peripheral region thus delimits, with the bottom of the cavity, an advantageously hermetic cavity wherein the buffer layer is situated. This buffer layer is in general a layer of polymer, a material that is very sensitive to certain treatments and/or solvents, which limits the technological steps that can be carried out if this material is potentially accessible, in particular from the side of the substrate. Since this material is here possibly in a hermetic cavity, it is possible to perform all kinds of technological steps on the face of the substrate opposite to the face of the bonding that would not be possible if the buffer layer were accessible.

BRIEF INTRODUCTION OF THE FIGURES

The aims, objects, features and advantages of the invention will emerge more clearly from the detailed description of an embodiment thereof, which is illustrated by the following accompanying drawings, wherein.

The drawings are given by way of examples and are not limitative of the invention. They constitute outline representations intended to facilitate understanding of the invention and are not necessarily to the scale of practical applications. In particular, the relative thicknesses of the various layers and substrates may not represent reality.

DETAILED DESCRIPTION

Before beginning a detailed review of embodiments of the invention, optional features are stated below, which may optionally be used in accordance with any association or alternatively:

The step of removing the bottom of the cavity is configured so as to at least partly preserve the peripheral region.

The peripheral region is bonded to the first face of the second substrate by direct bonding. At the very least, it can advantageously be ensured that the bonding, at the peripheral region, does not involve a material identical to that of the buffer layer.

The peripheral region may be bonded to the first face of the second substrate in order to form the entire bonding interface.

A step of removing the buffer layer is performed after the step of removing the bottom of the cavity.

The step of removing the bottom of the cavity is performed so as to reach the buffer layer from the second face of the first substrate.

The step of removing the bottom of the cavity of the first substrate comprises planing.

A step of thinning the second substrate is performed from a second face opposite to the first face of said second substrate.

At least one component is formed on the second face of the second substrate after the thinning step.

Before the step of removing the bottom of the cavity, the thickness of the second substrate is chosen so as to be less than 200 microns.

A step of removing the peripheral region is performed after the step of removing the bottom of the cavity.

The step of removing the peripheral region comprises an etching.

A step of joining the second substrate with a third substrate is performed so that the second face of the second substrate is positioned facing a first face of the third substrate.

The joining step is performed after the step of removing the bottom of the cavity.

A step of disjoining the second substrate from the third substrate is performed.

The step of disjoining the second substrate from the third substrate comprises a step of cutting the second substrate so as to form, from the second substrate, a plurality of separate chips disjoined from one another.

A layer of adhesive material is deposited on the third substrate on its first face; said layer forming a bonding interface for fixing together the second substrate and the third substrate.

The step of removing the peripheral region is performed after the step of fixing together.

The cavity is at least partially filled with a buffer layer, the buffer layer being accessible from the second face of the first substrate.

The buffer layer comprises a water-soluble material.

The cavity extends at a depth of less than 500 microns and the peripheral region extends over a width of less than 10 millimeters. According to one example, this would correspond to a cavity width of 180 millimeters for a substrate with a diameter of 200 millimeters.

Said second substrate is thinned as from its second face, opposite to the first face.

The second substrate has a thickness of less than 200 microns.

At least one from the first face and the second face of the second substrate comprises at least one component.

The invention relates to the transformation of electronic devices, preferably microelectronic devices. According to the invention, microelectronic device means a device comprising elements with micron and/or nanometric dimensions. The preferential purpose of the following method is to produce a (micro)electronic device with reference to FIGS. 1 to 10. Device preferentially means a chip or a wafer comprising at least one chip.

Figure 1:
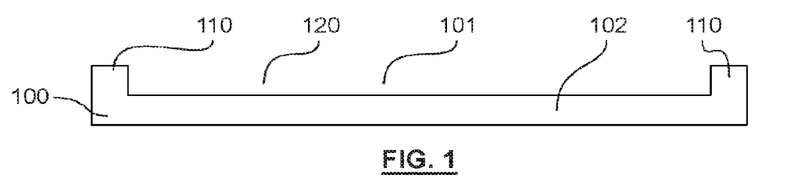
FIG. 1 illustrates a substrate comprising at least one cavity bordered by at least one peripheral region.
Figure 2A:
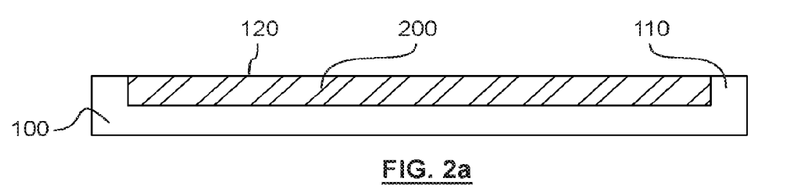
FIGS. 2a, 2b, 2c and 2d illustrate the substrate provided with a cavity provided with a buffer layer. The inserted figure of 2c represents a plan view of FIG. 2c.
Figure 2B:
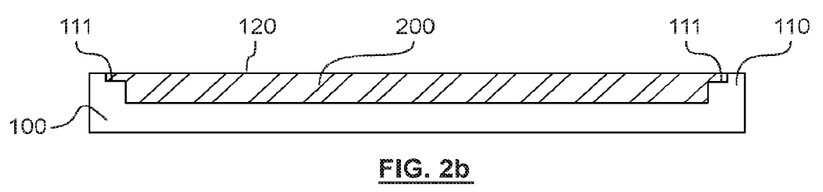
Figure 2C:
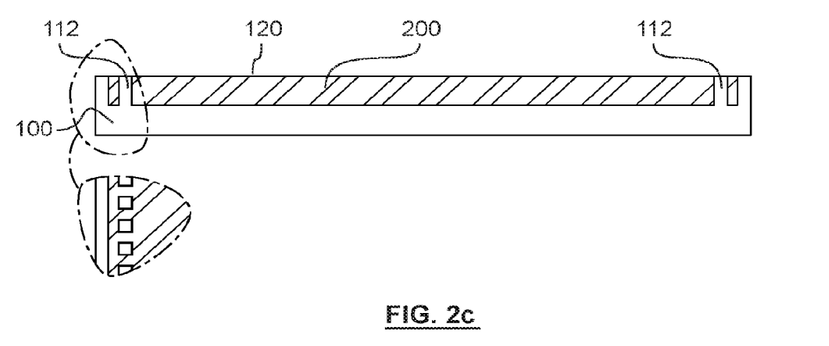
Figure 2D:
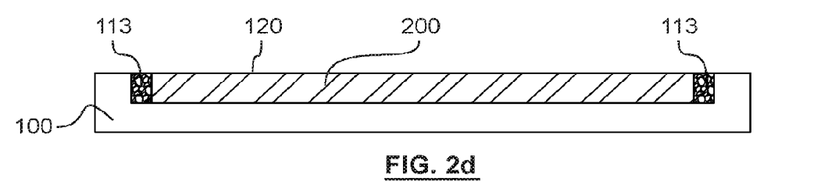

FIG. 1 illustrates a first substrate 100 provided with at least one cavity 120 formed from a first face 101, opposite to a second face 102 of said first substrate 100. The cavity 120 has a bottom extending across a width dimension on a plane perpendicular to the thickness of the substrate 100 and extending on a thickness dimension along a plane parallel to the thickness of the substrate 100; the bottom of the cavity 120 comprising a part of the thickness of the first substrate 100. The cavity has a depth dimension extending across the thickness of the first substrate 100. The sum of the thickness of the bottom of the cavity 120 and the depth of the cavity 120 forms the thickness of the first substrate 100. The cavity 120 has, in relation to the thickness of the bottom, an extra thickness on the edges or peripheral region 110. The peripheral region has a height dimension extending across the thickness of the first substrate 100 advantageously equal to the thickness of the first substrate 100. According to a preferred embodiment, the peripheral region 110 is situated at the border of the substrate. The peripheral region 110 is advantageously in the form of a closed contour. The peripheral region 110 may have any form. It may for example be annular in shape across a cutting plane with respect to the thickness of the substrate. The peripheral region 110 comprises a wall, the wall having an internal face delimiting the cavity 120 and an external face, with respect to the cavity 120. The wall of the peripheral region 110 emerges on both the front face and the rear face of the substrate. The part of the peripheral region emerging on the front face (the first face) forms a region, preferably planar, which produces a surface of the substrate overhanging the cavity 120. This region is preferably parallel to a surface matching the first face of the second substrate. Advantageously, the first substrate is caused to be put in contact with the second substrate only through this region. The first substrate 100 is preferably formed from a material based on silicon (for example polycrystalline silicon). The first substrate 100 may also, in whole or in part, be made from polysilicon or glass in particular. Particularly advantageously, the present invention applies to any type of substrate. Thus a substrate based on silica, sapphire or germanium may be used just as well as a substrate based on metal. The substrate may also be multilayer. According to a non-limitative example embodiment of the invention, the peripheral region 110 has a height, extending across the thickness of the first substrate 100, of between 100 and 500 microns and a width, extending perpendicular to the thickness of the first substrate 100, of between 2 and 10 millimeters.

FIGS. 2a, 2b, 2c and 2d illustrate a step of filling the cavity 120 with a buffer layer 200. Advantageously, the function of the buffer layer 200 is to come into contact with components and/or the face 101 of the substrate 100 that carries them and contributes to the mechanical rigidity of the assembly. The buffer layer 200 comprises a material that may be a polymer, an adhesive or a water-soluble material (such as salt). By way of example, it may be polymer with a reference BSI5150 marketed by Brewer or with the reference LC5200 marketed by 3M. The buffer layer 200 preferably comprises a viscous material. Particularly advantageously, the peripheral region 110 may comprise means on its internal wall for allowing expansion of the material forming the buffer layer 200, following temperature variations. According to an embodiment illustrated in FIG. 2b, it may in particular be a shoulder 111 at the peripheral region 110. According to another embodiment illustrated in FIG. 2c, it may also be a complementary cavity 112 produced in the peripheral region 110 and communicating with the cavity 120 to make it possible to receive any material of the buffer layer 200 that would be in excess. The complementary cavity may, according to one example, be in the form of pillars 112 (seen from above in FIG. 2c). According to another example embodiment illustrated in FIG. 2d, the peripheral region 110 may also comprise a porous material 113, for example porous silicon.

Preferably, the buffer layer does not cover the top surface of the peripheral region 110 exposed at the first face 101. For example, the height of the buffer layer may be less than or equal to the one between the internal wall of the bottom of the cavity and the top surface of the peripheral region 110. The material of the buffer layer is therefore then circumscribed by the volume delimited by the cavity 120.

Preferably, the cavity is the only one on the first substrate 100 and/or is configured so as to receive facing it the whole of the first face of the second substrate apart from the part of the first face of the second substrate that is in contact with the peripheral region 110.

Figure 3:
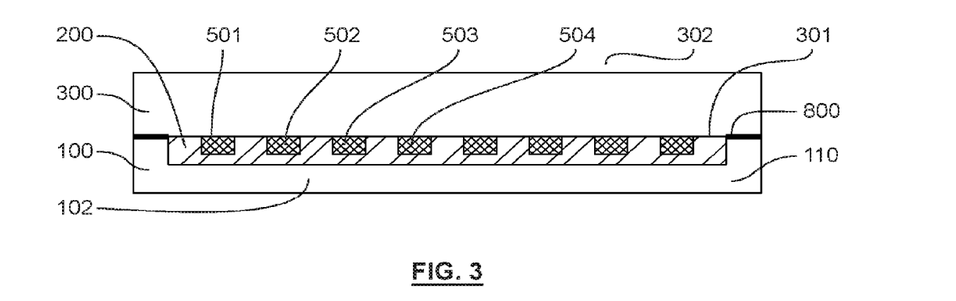
FIG. 3 illustrates a step of relative positioning of the substrate with an additional substrate.

FIG. 3 illustrates a step of relative positioning of a second substrate 300 on the first substrate 100 so that a first face 301 of the second substrate 300 is facing the cavity 120 (that is to say facing the first face 101) of the first substrate 100. The second substrate 300 is preferably formed from a material based on silicon (for example polycrystalline silicon). The first substrate 100 may also be made from glass or be based on silicon, sapphire or germanium in particular. The second substrate 300 may also be based on metal. The second substrate 300 may be multilayer. The first substrate 100 and the second substrate 300 are preferably secured together by a bonding interface 800. Advantageously, the bonding interface 800 is a direct bonding (without adhesive material). According to one embodiment, the bonding interface 800 is a metallic bonding. According to another embodiment, the bonding interface 800 comprises an adhesive of the polymer type. According to a preferred embodiment, prior to the positioning step, technological steps are performed on the first face 301 of the second substrate 300 with a view to forming functional components or devices such as vias, transistors, antennas, microfluidic systems or electromechanical microsystems (MEMSs); the components comprising for example an electrical connection member, or in other words any type of member that can be put in electrical continuity. The components may for example comprise an electrical via portion. They are advantageously formed using lithography, etching, deposition and heat treatment techniques. In the figures, for reasons of simplification, only the parts of the devices projecting from the substrate are depicted and referenced 501, 502, 503, 504. These projecting parts generally correspond to connection pads (also known as "bumps" or "copper pillars"), the active parts of the components being "buried" in the substrate and not shown in the diagrams. These connection pads may be produced in particular from copper and/or tin and/or silver. Particularly advantageously, the components 501, 502, 503, 504 are produced so as to have a thickness dimension (projecting with respect to the surface) extending across the thickness of the first substrate 100 less than the thickness of the buffer layer 200 and therefore less than the depth of the cavity 120; the thickness of the buffer layer 200 extending across the thickness of the substrate 100. Advantageously, the buffer layer 200 is configured so as to accommodate the components 501, 502, 503, 504.

Advantageously, at least part of the first phase 301 of the second substrate 300 is in contact with the buffer layer 200. Particularly advantageously, the adhesion energy is almost zero or zero between the material of the buffer layer 200 of the first substrate 100 and the first face 301 of the second substrate 300. Preferably, this energy is strictly less than that produced at the peripheral region. Thus the joining between the first and second substrates 100, 300 is provided essentially at the peripheral region and is temporary; the first and second substrates 100, 300 being able to be subsequently disjoined without exerting excessive mechanical forces on one or other of the substrates 100, 300.

According to the embodiment where at least one cavity is produced on the internal wall of the peripheral region 110 of the first substrate 100, said cavity can advantageously enable the material of the buffer layer 200 to reorganise itself, so as to provide good contact with the first face 301 of the second substrate 300, and in particular in the case where said second substrate 300 has significant topography. Particularly advantageously, the contact between the material of the buffer layer 200 and the first face 301 of the second substrate 300 provides mechanical strength of said first and second substrates 100, 300.

Figure 4:
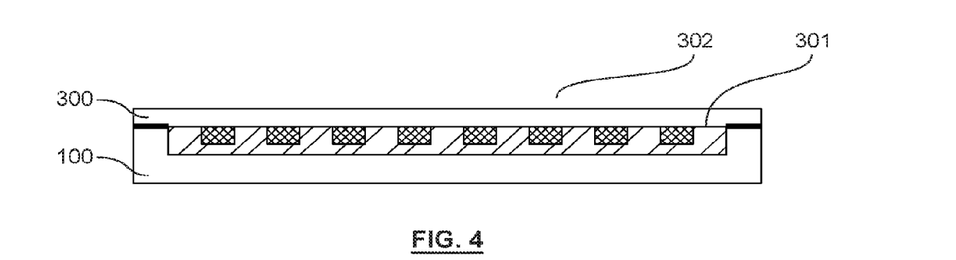
FIG. 4 illustrates a step of thinning the additional substrate by the rear face.

FIG. 4 illustrates a step of thinning the second substrate 300 from a first face 302, opposite to the first face 301 of said second substrate 300. According to one embodiment, the thinning is carried out by planing, for example by means of a diamond wheel, optionally supplemented by chemical mechanical polishing. Advantageously, the first substrate 100 associated with the buffer layer 200 serves as a mechanical support for the second substrate 300 so that the second substrate 300 does not undergo any deformation or even cracking during thinning thereof. In particular, the buffer layer 200 makes it possible to damp the movements or vibrations of the second substrate 300 in abutment on the first substrate 100, during the thinning step. Particularly advantageously, the second substrate 300 has a thickness preferably of between 20 and 200 microns after the thinning step, typically around 80 microns.

Figure 5:
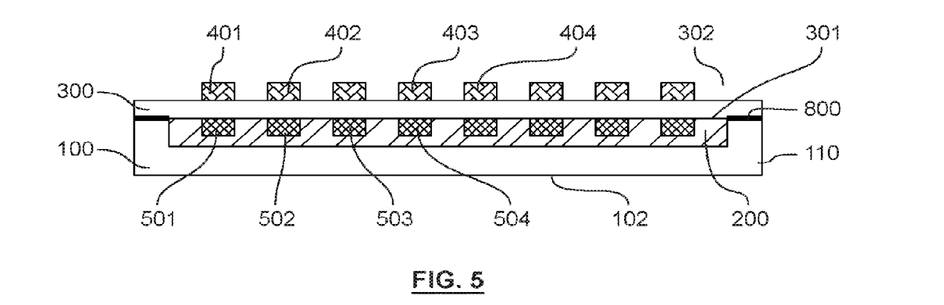
FIG. 5 illustrates a step of performing technological steps from the thinned face of the additional substrate.

FIG. 5 illustrates a preferred embodiment wherein, after the step of thinning the second face 302 of the second substrate 300, technological steps are performed with a view to forming, on said second face 302 of the substrate 300, functional components or devices 401, 402, 403, 404; said components comprise for example an electrical connection member, or in other words any type of member that can be put in electrical continuity. They are advantageously formed using for example lithography, etching, deposition and heat treatment techniques.

Figure 6:
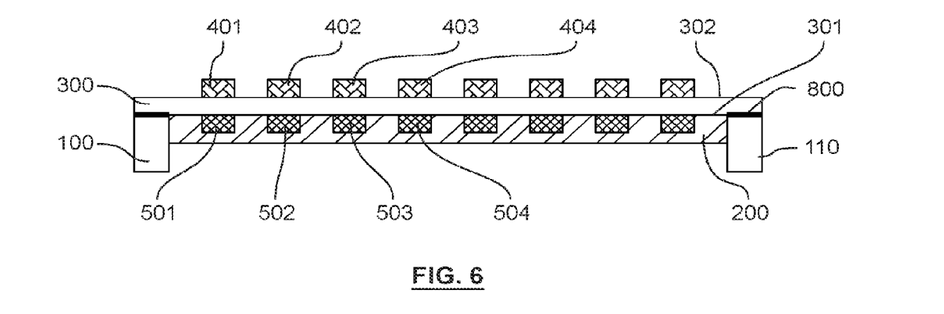
FIG. 6 illustrates a step of removal of the bottom of the cavity of the substrate.

FIG. 6 illustrates a step of removing the bottom of the cavity 120 performed so as to eliminate the first substrate 100 before the first layer 200. Particularly advantageously, the removal step is performed so as to leave in place the peripheral region 110 of the first substrate 100. Advantageously, the step of partial removal of the bottom of the cavity 120 is performed so as to uncover the buffer layer 200 from the second face 102 of the first substrate 100. According to one embodiment, the removal step is performed by chemical mechanical polishing. By way of example, the removal step is performed by means of a diamond wheel. In this particular embodiment, the thickness of the peripheral region 110 is reduced. According to another embodiment, the step of removing the bottom of the cavity 120 is performed by etching, for example chemical. By way of example, chemical etching based on tetramethylammonium hydroxide (TMAH or TMAOH) could be suitable for removing the bottom of the cavity 120 of the first substrate 100 formed from a material based on silicon for example. This etching, being isotropic, is particularly carried out after masking of the part of the second face 102 corresponding to the peripheral region 110. According to a preferential embodiment, the step of removing the bottom of the cavity 120 is performed by anisotropic etching, for example by means of plasma etching.

Figure 7:
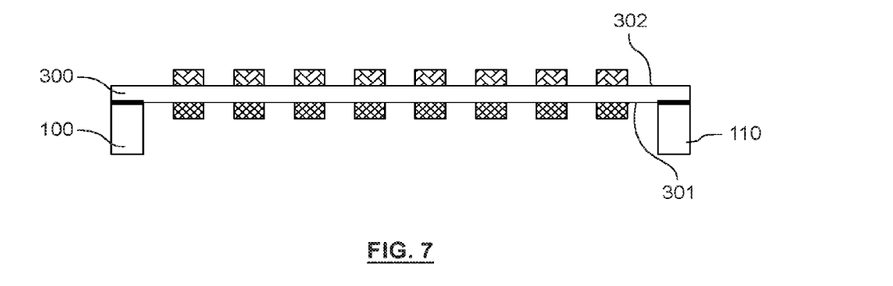
FIG. 7 illustrates a step of removing the buffer layer.

FIG. 7 illustrates the step of removing the first layer 200 as from the second face 102 of the first substrate 100. The step of removing the buffer layer 200 is preferably performed by etching. According to one embodiment, the buffer layer 200 is removed by chemical etching, for example by means of a suitable solvent, or by dry (plasma) etching. It is also possible to effect mechanical peeling of the buffer layer 200. In this case, an adhesive film is for example laminated on the buffer layer 200, this film having an energy of adhesion between the buffer layer 200 greater than the adhesion energy between the buffer layer and the first face 101 of the substrate 300. Next the adhesive film is peeled, which draws with it the buffer layer 200. Particularly advantageously, the step of removal of the buffer layer 200 is facilitated by virtue of the weak adhesion existing between the material of the buffer layer 200 and the first face 301 of the second substrate 300.

Figure 8:
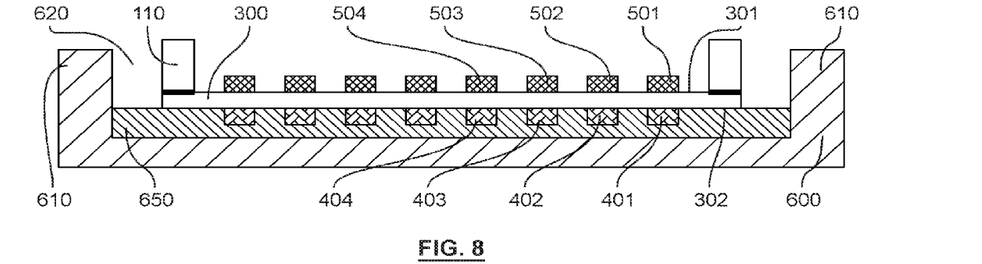
FIG. 8 illustrates a step of positioning the additional substrate on a third substrate.

FIG. 8 illustrates the step of joining of the second substrate 300 on the third substrate 600 so that the second face 302 of the second substrate 300 is facing the first face of the third substrate 600. The third substrate 600 is preferably formed from a material based on silicon (for example polycrystalline silicon). The third substrate may also, in whole or in part, be made from polysilicon or glass. Particularly advantageously, the present invention applies to any type of substrate. Thus a third substrate 600 based on silicon, sapphire or germanium may be used just as well as a substrate based on metal. The third substrate 600 may be multilayer. Advantageously, the third substrate 600 comprises at least one cavity 620 produced as from the first face of the third substrate 600. The cavity 620 of the third substrate has a protrusion on the edges or peripheral region 610. The third substrate 600 preferably comprises an adhesive layer 650 formed on a cutout frame. According to one example, the adhesive layer 650 comprises a heat-conductive adhesive or an adhesive that can be activated by ultraviolet rays. Particularly advantageously, the components 401, 402, 403, 404 are produced so as to have a thickness dimension, extending across the thickness of the first substrate 100, less than the thickness of the adhesive layer 650, that is to say less than the depth of the cavity 620. Advantageously, the adhesive layer 650 is configured so as to accommodate the components 401, 402, 403, 404 formed on the second substrate 300, and optionally to come into contact with the second face 302. According to a non-limitative example embodiment of the invention, the peripheral region 610 has a depth extending across the thickness of the third substrate 600 of between 100 and 500 microns and a width extending perpendicular to the thickness of the first substrate 100 of between 2 and 10 millimeters. Particularly advantageously, the peripheral region 610 stiffens the assembly comprising the third substrate 600 secured to the second substrate 300. The step of securing the second substrate 300 to the third substrate 600 is facilitated by the rigidity of the third substrate 600, which advantageously supports the second substrate 300; said second substrate 300 previously having undergone thinning.

The peripheral region 110 is preferably left in place for the securing step and constituting a handle assisting the manipulation of the second substrate 300. The fact that the peripheral region is bonded to the second substrate makes it possible, after elimination of the buffer layer, for at least part of this peripheral region to remain in contact with the second substrate participating in the rigidity of the structure obtained and manipulation thereof.

In a variant, a rigid peripheral ring is available (corresponding solely to 610), for example metal or plastic, around the substrate 300, and a dual layer composed of a film, for example plastic (corresponding to the bottom of the cavity, and a glue or polymer (corresponding to 650) is laminated on the assembly, on the same side as the face 302 of the substrate 300. This dual layer may for example be a dual layer referenced SP-537T-230 marketed by Furukawa. The laminator used may be the laminator referenced 850 marketed by EVG.

Figure 9:
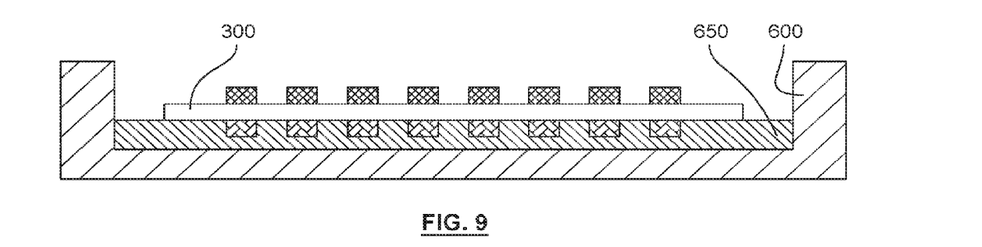
FIG. 9 illustrates a step of removing the peripheral region of the first substrate.

FIG. 9 illustrates a step of removing the peripheral region 110 secured to the second substrate 300. The thinned second substrate 300 acquires rigidity through its joining to the third substrate 600. The peripheral region 110 of the first substrate 100 fixed to the second substrate may thus be removed without causing damage to the second substrate 300. The peripheral region 110 may be removed by chemical etching or chemical mechanical etching by grinding by means of a diamond saw, for example. According to one embodiment, the peripheral region 110 may be removed before the removal of the buffer layer 200. In this case, the buffer layer 200 may serve as protection in the case of chemical etching.

Figure 10:
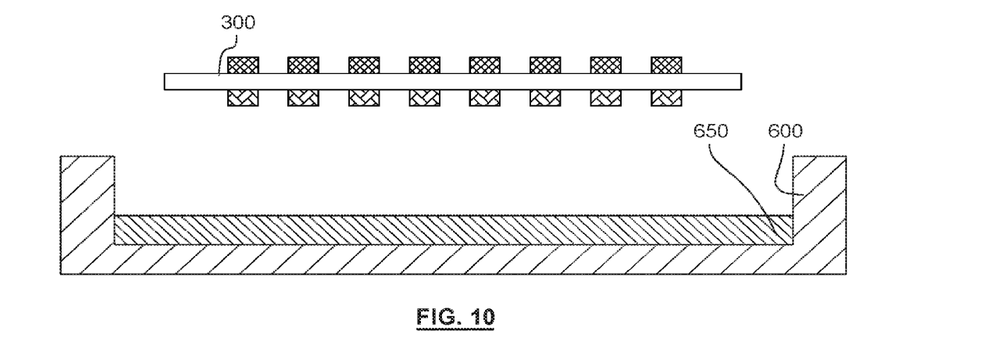
FIG. 10 illustrates a step of disjoining the additional substrate from the third substrate.

FIG. 10 illustrates a step of disjoining the second substrate 300 and third substrate 600. The disjoining step is facilitated by virtue of the weak adhesion between the second and third substrates facing each other. The disjoining step is performed for example by chemical etching of the adhesive layer 650. In a variant, in the case of a plastic film/adhesive dual layer, it is possible also to insolate the layer 650 through the plastic film by means of ultraviolet radiation for example. This radiation causes crosslinking of the glue, which shrinks and thus completely disjoins the second face 302 of the substrate 300, causing disjoining of the second substrate 300 and third substrate 600.

A non-limitative example embodiment of the invention is presented below. This example represents a practical case; the choice of the materials and dimensions are given by way of indication and preferentially and are in no way limitative of the present invention. Using a 300 millimeter diameter wafer for a first substrate 100, thinning of a first silicon substrate 100 is carried out, preferentially by means of a diamond wheel. Advantageously, cavity 120 is formed on said first substrate 100 provided with a peripheral region 110. The depth of the cavity 120 extending across the thickness of the first substrate 100 is preferably around 300 microns and the width of the cavity 120 extending perpendicular to the thickness of the first substrate 100 is preferably around 3 millimeters. The cavity 120 of the first substrate 100 is filled with a buffer layer 200, for example by means of a resin crosslinked under ultraviolet. The thickness of the buffer layer 200 is preferably around 300 microns.

Prior to a step of relative positioning of a second substrate 300 on the first substrate 100, a bonding interface 800 is preferably formed on the top face of the peripheral region 110. Advantageously, the bonding interface 800 is in the form of an adhesive layer. The second substrate 300 is preferably chosen so as to be based on silicon. A top layer, preferably based on silicon nitride, with a thickness of approximately 100 manometers, is formed on the first face 301 of the second substrate 300. Advantageously, the second substrate 300 is next transferred onto the first substrate 100 so that the first face 301 of the second substrate 300 is positioned facing the cavity 120 of the first substrate 100. The first and second substrates 100, 300 are preferably joined together by means of the bonding interface 800. This bonding step is performed at a preferential temperature of around 180° C. in order to promote the phenomena of adhesion between the first faces 101, 301 of the two substrates 100, 300 facing each other.

Advantageously, the second substrate 300 undergoes thinning as from its second face 302, opposite to the first face 301. The thinning is for example carried out by polishing by means of a diamond wheel. The thinning is advantageously carried out until a thickness of the second substrate 300 of around 80 microns is obtained. After the step of thinning as from the second face 301 of the second substrate 300, an additional layer is formed, preferably based on silicon dioxide, on said second face 301 of the second substrate 300. This additional layer is produced at a temperature of 150° C. and has a thickness for example of around 1 micron.

Advantageously, the partial removal of the bottom of the cavity 120 of the first substrate 100 is next proceeded with so as to reach the first layer 200 as from the second face 102 of the first substrate 100. The removal of the bottom of the cavity 120 is for example carried out by thinning by means of a diamond wheel.

Preferentially, the removal of the first layer 200 is next proceeded with so as to reach the first face 301 of the second substrate 300. The removal is carried out for example by mechanical peeling by means of an adhesive band.

Preferably, the second substrate 300 is positioned in relation to a third substrate 600. The third substrate comprises an adhesive layer 650 previously formed on a frame with a preferential thickness of 450 millimeters. A step of cutting chips preferably by means of a diamond saw is performed. Preferentially, the chips are separated from the adhesive layer by insolation by means of ultraviolet rays, causing crosslinking of the adhesive layer.

Particularly advantageously, the order wherein the separation steps are performed has no importance and depends on the application. Advantageously, the buffer layer 200 may be removed, according to a first embodiment, before the step of fixing the second substrate 300 to the third substrate 600 comprising the adhesive layer 605 and the frame. According to a second embodiment, the buffer layer 200 may be removed after the step of fixing the second substrate 300 on said third substrate 600 or after the removal of the peripheral region 110 of the first substrate 100.

It is possible, according to the method of the present invention, to repeat the step of positioning of the second substrate 300 on a new "support" in order to perform further technological steps on the first face 301 after elimination of the first layer 200. For this purpose, a step of fixing the second substrate 300 on a new substrate comprising a buffer material is performed. This new assembly (second substrate supported by an additional substrate serving as a support) will be dismantled at the end of the method before bonding on the new support substrate. The trimming or removal of the peripheral region 110 of the first substrate 100 supported by the third substrate 600 is not always necessary; a cutting of the chips can in fact be carried out when the peripheral region 610 is present.

The method according to the invention makes it possible to form an electronic device with a smaller thickness (around 20 microns) perfectly supported by a third substrate 600 comprising an adhesive layer on a first face deposited on a frame. This advantageously prevents the appearance of cracks on the electronic device. Prior to the disjoining of the second substrate 300 and the third substrate 600, the second substrate 300 may advantageously undergo additional cutting steps, for example by means of a diamond saw, so as to release the chips present on said second substrate 300.

The present invention makes it possible, in a particularly advantageous manner in the case where the second substrate 300 obtained after the separation is particularly fine (meaning a thickness less than 200 microns, or if high mechanical stress presents itself, fixing to the adhesive layer 650 associated with the frame affords easily handling without risk of cracking.

Moreover, the method for disjoining the chips by cutting the second substrate 300 is facilitated via the use of the third substrate 600, comprising the adhesive layer 650 and the frame.

Particularly advantageously, the method according to the present invention is compatible with an industrial environment. The system is compatible with methods where the temperature approximates to 250° C. in the case of adhesive bonding at the interface 800 and up to 400° C. or even beyond in the case of direct bonding, for example metallic. During the step of bonding the first face 301 of the second substrate 300 on the first face 101 of the first substrate 200, in particular in the case where the first face 301 of the second substrate 300 has significant topography, the holes provided on the internal wall of the peripheral region 110 of the first substrate 100 provide good contact between the material of the buffer layer 200 and the second substrate 300. The holes also allow good thermal expansion of the material if necessary.

Particularly advantageously, the method according to the present invention makes it possible to dispense with a complex trimming step performed on a thinned substrate; said step being able to damage said thinned substrate.

The present invention is not limited to the embodiments described above but extends to any embodiment in accordance with its spirit.

The invention claimed is:

1. A method for transforming an electronic device from an initial state,
    the device comprising a first substrate and a second substrate joined by means of a bonding interface at their respective first faces,
        the first substrate comprising at least one cavity produced using the first face of the first substrate,
        said cavity comprising a bottom bordered by at least one peripheral region and being at least partially filled with a buffer layer,
        the first face of the second substrate at least partly facing the at least one cavity of the first substrate,
        the second substrate comprising at least one component, a portion of which extends above the first face of the second substrate and is in contact with the buffer layer, and
        the at least one peripheral region being bonded to the first face of the second substrate without a presence of a material of the buffer layer at the bonding interface and forming at least part of the bonding interface, and
    the method comprising removing the bottom of the at least one cavity of the first substrate as from a second face of the first substrate that is opposite to the first face of the first substrate, the removing the bottom preserving at least partly the at least one peripheral region.

2. The method according to claim 1, further comprising removing the buffer layer after the removing of the bottom of the at least one cavity.

3. The method according to claim 1, wherein the at least one peripheral region is bonded to the first face of the second substrate by direct bonding, by metallic bonding, bonding based on silicon nitride, or by a polymer adhesive.

4. The method according to claim 1, wherein the at least one peripheral region is bonded to the first face of the second substrate and forms the entire bonding interface.

5. The method according to claim 1, wherein the removing of the bottom of the at least one cavity is performed so as to reach the buffer layer from the second face of the first substrate.

6. The method according to claim 1, further comprising thinning the second substrate from the second face of the second substrate that is opposite to the first face of said second substrate.

7. The method according to claim 6, wherein the at least one component is formed on the second face of the second substrate after performing the thinning.

8. The method according to claim 6, wherein, before the removing of the bottom of the at least one cavity, a thickness of the second substrate is less than 200 microns.

9. The method according to claim 1, further comprising removing the at least one peripheral region after the removing of the bottom of the at least one cavity.

10. The method according to claim 1, further comprising joining the second substrate to a third substrate, performed so that the second face of the second substrate is positioned facing a first face of the third substrate.

11. The method according to claim 10, wherein the joining is performed after the removing of the bottom of the at least one cavity.

12. The method according to claim 10, further comprising disjoining the second substrate from the third substrate.

13. The method according to claim 12, wherein the disjoining the second substrate from the third substrate is preceded by cutting the second substrate so as to form, from the second substrate, a plurality of separate chips being disjoined from one another.

14. The method according to claim 10, further comprising depositing a layer of adhesive material on the third substrate, said layer forming a bonding interface for the joining of the second substrate to the third substrate.

* * * * *